US007109818B2

(12) United States Patent
Rivkina et al.

(10) Patent No.: US 7,109,818 B2
(45) Date of Patent: Sep. 19, 2006

(54) TUNABLE CIRCUIT FOR TUNABLE CAPACITOR DEVICES

(75) Inventors: Tatiana Rivkina, Lakewood, CO (US); David S. Ginley, Evergreen, CO (US)

(73) Assignee: Midwest Research Institute, Kansas City, MO (US)

( * ) Notice: Subject to any disclaimer, the term of this patent is extended or adjusted under 35 U.S.C. 154(b) by 36 days.

(21) Appl. No.: 10/498,457

(22) PCT Filed: Dec. 14, 2001

(86) PCT No.: PCT/US01/48184

§ 371 (c)(1),
(2), (4) Date: Jun. 8, 2004

(87) PCT Pub. No.: WO03/052781

PCT Pub. Date: Jun. 26, 2003

(65) Prior Publication Data

US 2005/0007208 A1 Jan. 13, 2005

(51) Int. Cl.
*H01P 3/02* (2006.01)
*H01L 29/76* (2006.01)

(52) U.S. Cl. .................................... 333/24 C; 257/295

(58) Field of Classification Search ............. 333/24 C, 333/161, 238; 257/295, 307
See application file for complete search history.

(56) References Cited

U.S. PATENT DOCUMENTS

| | | | | |
|---|---|---|---|---|
| 5,168,249 | A | 12/1992 | Larson | |
| 5,358,775 | A | 10/1994 | Horn, III | |
| 5,604,375 | A | 2/1997 | Findikoglu et al. | |
| 5,721,194 | A | 2/1998 | Yandrofski et al. | |
| 5,742,471 | A | 4/1998 | Barbee, Jr. et al. | |
| 5,808,527 | A | 9/1998 | De Los Santos | |
| 5,990,766 | A | 11/1999 | Zhang et al. | |
| 6,077,715 | A | 6/2000 | Chivukula et al. | |
| 6,096,127 | A | 8/2000 | Dimos et al. | |
| 6,110,531 | A | 8/2000 | Paz de Araujo et al. | |
| 6,146,905 | A | 11/2000 | Chivukula et al. | |
| 6,187,717 | B1 | 2/2001 | Wikborg et al. | |
| 6,207,522 | B1 | 3/2001 | Hunt et al. | |
| 6,211,035 | B1 | 4/2001 | Moise et al. | |
| 6,229,684 | B1 | 5/2001 | Cowen et al. | |
| 6,377,142 | B1 * | 4/2002 | Chiu et al. | 333/238 |
| 6,377,217 | B1 * | 4/2002 | Zhu et al. | 343/700 MS |
| 6,727,535 | B1 * | 4/2004 | Sengupta et al. | 257/295 |

* cited by examiner

*Primary Examiner*—Dean Takaoka
(74) *Attorney, Agent, or Firm*—Paul J. White

(57) ABSTRACT

A tunable circuit (10) for a capacitively tunable capacitor device (12) is provided. The tunable circuit (10) comprises a tunable circuit element (14) and a non-tunable dielectric element (16) coupled to the tunable circuit element (16). A tunable capacitor device (12) and a method for increasing the figure of merit in a tunable capacitor device (12) are also provided.

21 Claims, 3 Drawing Sheets

TUNABLE CIRCUIT FOR TUNABLE CAPACITOR DEVICES

CONTRACTURAL ORIGIN OF THE INVENTION

The United States Government has rights in this invention under Contract No. DE-AC36-99GO-10337 between the U.S. Department of Energy and the National Renewable Energy Laboratory, a Division of Midwest Research Institute.

TECHNICAL FIELD

This invention relates generally to a tunable circuit for use in RF tunable devices where the tuning is achieved via variable capacitance either in a lumped element capacitor or in distributed circuits and, more particularly, it relates to a tunable circuit which increases-the figure of merit (performance vs. noise) and achieves the low voltage requirements for a practical tunable capacitor device by coupling a low loss, non-tunable capacitive element with a tunable element.

BACKGROUND ART

Tunable RF devices such as filters, phase shifters, and oscillators are typically built using semiconductor diodes, so called varactors, in which the capacitance is controlled via external bias. While the main line varactors are inexpensive and robust, they are only suitable for applications up to 10 GHz. Above this frequency, the energy dissipated in such varactors is prohibitively high (low quality factor Q). In some GaAs varactors, the range of operation is extended to much higher frequencies. The high cost of manufacturing for such devices, however, makes them impractical for most applications.

Recently, tunable dielectrics, such as Balium Strontium Titanate (BST), have been employed as the active elements in tunable capacitor devices and are becoming increasingly important for a large number of microwave applications. Utilizing a tunable dielectric element in tunable capacitance devices, especially at frequencies over 20 GHz, has been shown to increase the figure of merit (performance vs. noise) of the tunable capacitor device with a lower cost than other conventional technologies. BST thin film and especially BST/MgO thick and thin films composites have demonstrated unparalleled performance at high MW frequencies up to 60 GHz. They also have low power requirements, but need voltages in some applications. Thus, incorporation of the tunable dielectric elements provides high performance at low cost.

While the figure of merit of the tunable dielectric devices can be sufficiently high, such as those with composite materials, the voltage requirements of these devices are typically too high (300V). The standard employed for the lower frequency applications typically designs for tuning voltages in the range of 20–40 V. There is a pressing need to develop lower voltage tunable devices with a high figure of merit so as to achieve high levels of performance at microwave frequencies, i.e., this requires the amount of tuning to be maximized and the amount of loss to be minimized, while satisfying industry requirements for the low operating voltages.

DISCLOSURE OF THE INVENTION

The present invention is a tunable circuit for capacitively tunable devices. The tunable circuit comprises a tunable circuit element and a non-tunable dielectric element coupled to the tunable circuit element. At least one AC terminal contacts the non-tunable dielectric element.

The present invention additionally includes a method for substantially increasing the figure of merit in a tunable capacitor device. The method comprises providing a tunable element, providing a non-tunable element, and coupling the tunable element to the non-tunable element.

The present invention further includes a tunable capacitor device. The tunable capacitor device comprises a non-tunable dielectric element and a tunable dielectric element. The tunable dielectric element is electrically connected to the non-tunable element thereby forming a combined dielectric element. A plurality of contacts are mounted to the combined dielectric element with at least one of the contacts electrically connected to the non-tunable dielectric element.

BRIEF DESCRIPTION OF THE DRAWINGS

The accompanying drawings, which are incorporated in and form a part of the specification, illustrate the preferred embodiments of the present invention, and together with the descriptions serve to explain the principles of the invention.

In the Drawings.

DETAILED DESCRIPTION OF THE PREFERRED EMBODIMENTS

As illustrated in FIGS. 1–8, the present invention is a tunable high frequency circuit, indicated generally at 10, for use in a capacitively tunable device 12. The tunable device 12 can contain any type of tunable capacitor where the figure of merit is limited by the loss including, but not limited to, semiconductor varactors, tunable dielectric capacitors, and distributed elements with adjustable capacitance such as might be used in electronically steerable antennas, oscillators, filters, and phase shifters.

The present invention relates to lumped element tunable capacitors such as semiconductor varactors, tunable dielectric capacitors, and any other tunable capacitive elements limited by loss performance. It also relates to distributed circuits such as, for example, coplanar phase shifters where the tuning action is achieved by changing the dielectric constant of a tunable dielectric media (changing equivalent capacitance) with DC bias.

Figure 1:
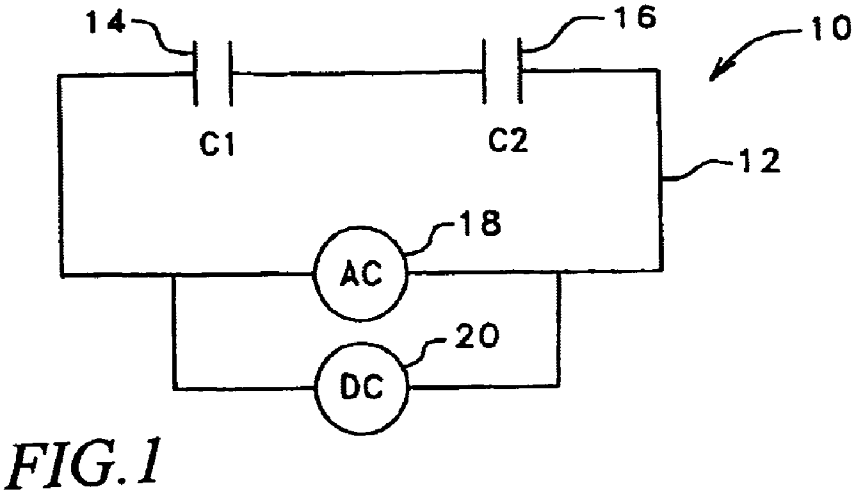
FIG. 1 is a circuit diagram of the tunable dielectric circuit, constructed in accordance with the present invention, with a non-tunable element coupled together with a tunable element.
Figure 2:
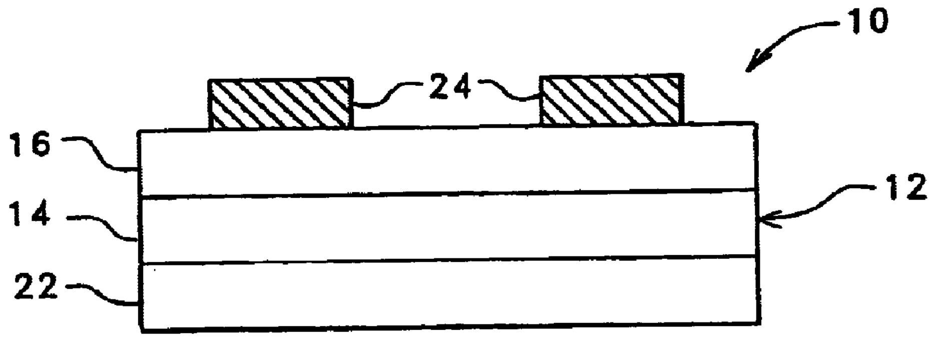
FIG. 2 is an elevational side view of an embodiment of the circuit diagram in FIG. 1 for the tunable dielectric circuit, constructed in accordance with the present invention, with the non-tunable element coupled together with the tunable element in a layered structure.

As illustrated in FIG. 1, in an embodiment of the tunable circuit 10, the non-tunable dielectric element 16 can be coupled together with the tunable circuit element 14 as a single lumped element. As illustrated in FIG. 2, in another embodiment of the tunable dielectric circuit 10, the non-tunable dielectric element 16 can be coupled together with the tunable circuit element 14 in a layered structure. In FIG. 1, C1 represents the tunable circuit element 14 and C2 represents the non-tunable dielectric element 16. AC represents the microwave signal 18 and DC represents the bias voltage 20. The improved tunable circuit 10 of FIGS. 1 and 2 provides improved figure of merit (tuning/loss) parameters in tunable circuit elements 14 and in lumped elements with non-tunable dielectric elements 16 where the improvement occurs because of the ability to improve the Q factor for the tunable capacitor device 12. The bias voltage in this configuration increases compared to the bias voltage of the tunable element alone.

Still referring to FIG. 2, to construct the tunable dielectric circuit 10 of the present invention, the tunable dielectric element 14 is formed on a substrate 22. The non-tunable dielectric element 16 is then layered onto the tunable dielectric element 14. Next, a pair of contacts 24 is electrically connected to the non-tunable dielectric element 16. While this embodiment of the tunable dielectric circuit 10 of the present invention results in substantial improvement in the figure of merit of the tunable capacitor device 12, higher potentials or voltage are required due to the potential of the tunable capacitor device 12 extending across both the tunable circuit element 14 and the non-tunable dielectric element 16.

Figure 3:
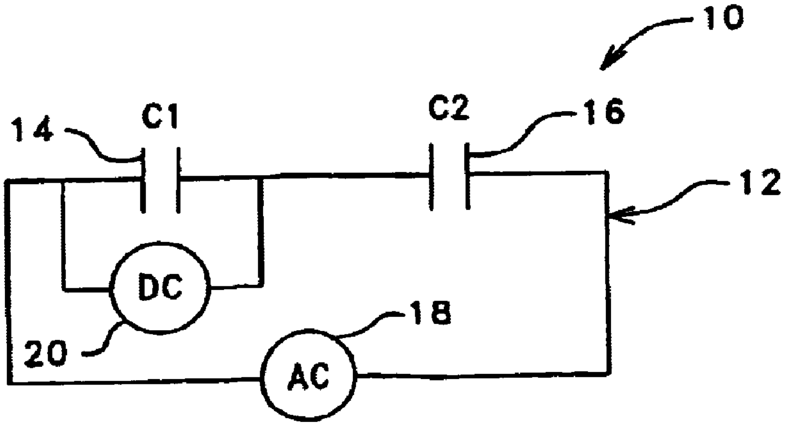
FIG. 3 is another circuit diagram for the tunable dielectric circuit, constructed in accordance with the present invention, with a three-electrode or four-electrode configuration allowing retention of the low control voltages of the combined tunable element.
Figure 4:
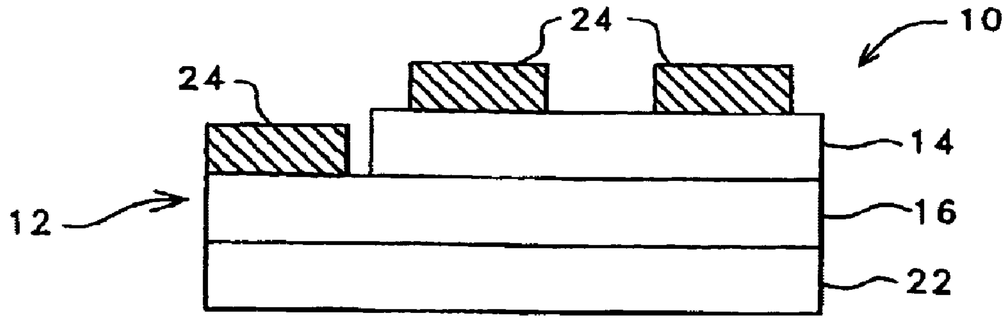
FIG. 4 is an elevational side view of the embodiment of the tunable dielectric circuit as in FIG. 3, constructed in accordance with the present invention, with the three-electrode or four-electrode configuration in a layered structure.

As illustrated in FIG. 3, in still another embodiment, the improved tunable dielectric circuit 10 of the present invention also includes the "three- or four-electrode" design that allows the improvement of the tuning/loss ratio of a tunable circuit element 14 without increasing control voltages. As illustrated in FIG. 4, in yet another embodiment of the tunable dielectric circuit 10 of the present invention, a layered structure positions the DC bias 20 only across the tunable dielectric element 14 but extracts the AC signal 18 from the whole tunable capacitor device 12.

Still referring to FIG. 4, to construct the tunable dielectric circuit 10 of the present invention, the non-tunable dielectric element 16 is formed on the substrate 22. The tunable circuit element 14 is then layered onto the non-tunable dielectric element 16. Next, a pair of contacts 24 is electrically connected to the tunable dielectric element 14 and a contact 24 is electrically connected to the non-tunable dielectric element. The embodiments of the tunable dielectric circuit 10 of the present invention, as illustrated in FIGS. 3 and 4, have the further advantage of increasing the figure of merit of the tunable capacitor device 12 while maintaining the low voltage requirement of the tunable dielectric element 14.

Figure 5:
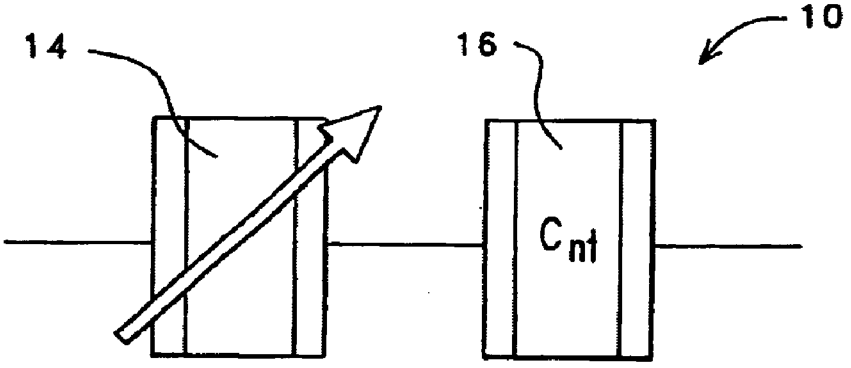
FIG. 5 is another embodiment of the two terminal tunable circuit, constructed in accordance with the present invention; where the non-tunable and tunable lumped element capacitors are combined together as in the circuit diagram in FIG. 1.

As illustrated in FIG. 5, another embodiment of the present invention, the non-tunable dielectric lumped element capacitor 16 is coupled with the tunable circuit lumped element capacitor 14 to improve the figure of merit of the tunable capacitor device 12. The tunable dielectric circuit 10 is low cost and potentially can be integrated with most designs of tunable capacitor devices 12.

Figure 6:
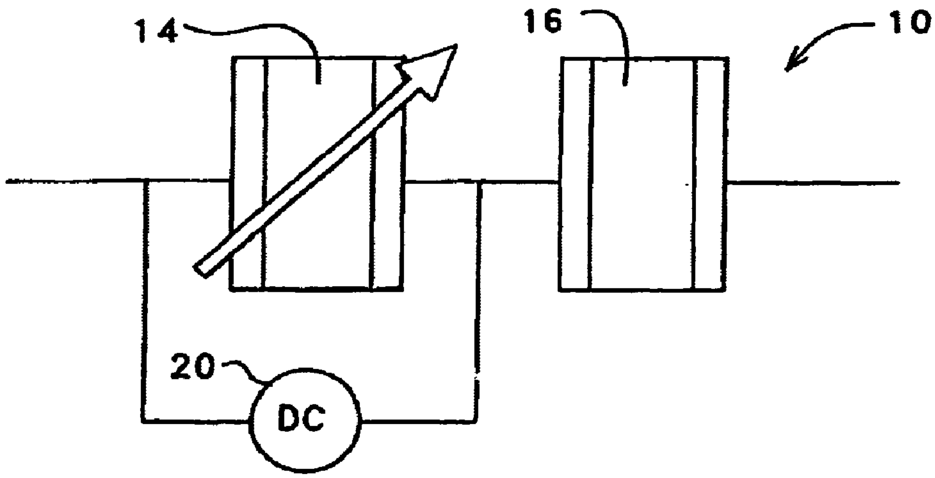
FIG. 6 is another embodiment of the more than two terminal tunable circuits, constructed in accordance with the present invention, where the tunable and non-tunable lumped element capacitors are combined together as in the circuit diagram of FIG. 3 with the three terminal configuration.

As illustrated in FIG. 6, another embodiment of the present invention, the non-tunable dielectric lumped element capacitor 16 is coupled with the tunable circuit lumped element capacitor 14 to improve the figure of merit of the tunable capacitor device 12. The third terminal added between the two capacitors will allow maintaining low control voltage of the tunable element 14. The tunable dielectric circuit 10 is low cost and potentially can be integrated with most designs of tunable capacitor devices 12.

Figure 7:
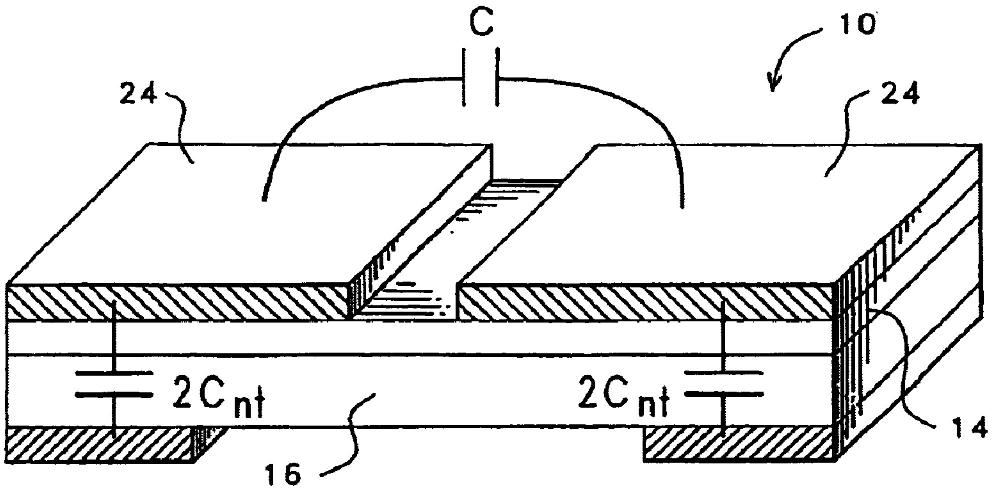
FIG. 7 is a perspective view of another embodiment of the tunable circuit diagram with four terminals, constructed in accordance with the present invention, with the low loss dielectric substrate such as $LaAlO_3$ or MgO or another dielectric providing mechanical support for the tunable dielectric thin film and also serving as non-tunable dielectric element electrically coupled to the tunable dielectric and the bottom electrodes being connected to the substrate are the AC terminals while the top electrodes being directly attached to the tunable dielectric are for the DC voltage control.

As illustrated in FIG. 7, another embodiment of the present invention is shown. In this arrangement, the low loss dielectric substrate, such as $LaAlO_3$ or MgO or another dielectric provides mechanical support for the tunable dielectric thin film and also serves as a non-tunable dielectric element electrically coupled to the tunable dielectric circuit layer 14. Furthermore, in this arrangement, the bottom electrodes 24 connected to the substrate are the AC terminals while the top electrodes 24 are directly attached to the tunable dielectric are for the DC voltage control.

Figure 8:
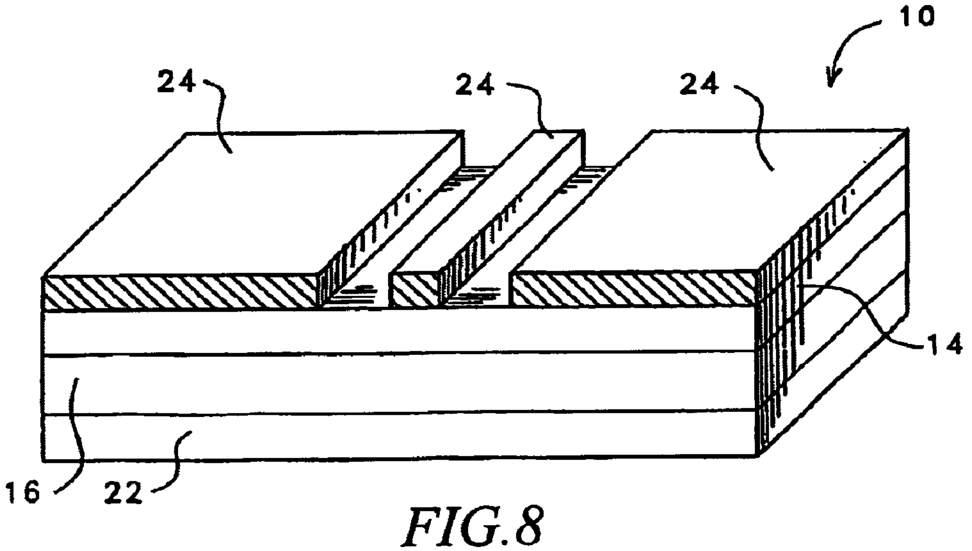
FIG. 8 is a perspective view of another embodiment of the tunable distributed circuit (coplanar waveguide phase shifter) where the low loss non-tunable dielectric layer is included to improve the performance of the device.

As illustrated in FIG. 8, another embodiment of the present invention, a layer of non-tunable dielectric element 16 coupled in series with tunable dielectric circuit 14 and the electrodes 24 of the waveguide contacting the non-tunable dielectric element 16.

In constructing the non-tunable dielectric element 16, non-tunable materials such as an inorganic solid-state dielectric material or dielectric polymer can be used. As illustrated in FIG. 6, the dielectric polymer is shown. The polymer non-tunable dielectric element 16 can be deposited by physical vapor deposition, spin coated, or ink jet written or deposited by other means on the tunable capacitor device 12 significantly improving fabrication of the tunable capacitor circuit 10. It is also within the scope of the present invention to utilize various polymers or polymer mixes to adjust the dielectric constant of the non-tunable dielectric element 16 so as to optimize performance of the tunable dielectric circuit 10.

A wide variety of polymers are available for a wide range of dielectric constants and processing temperatures for constructing the non-tunable dielectric element 16. Dielectric constants can be easily adjusted from two (2) to eight (8), for example. In addition, polymers with good breakdown characteristics may be chosen. For polystyrenes, for example, dielectric strengths are in the range of 100–600 KV/cm while in the Polyethylene terephthalate, the dielectric strengths can be up to 6000 KV/cm. The incorporation of polymers as the non-tunable dielectric element 16 reduces cost, improves design flexibility, and improves the ease of fabrication.

As discussed above, the essence of the present invention is to increase the figure of merit of the tunable capacitor devices 12, i.e., improve tuning and reducing loss. By coupling the microwave signal into a non-tunable low loss capacitance element 16 in series with a conventional tunable capacitive element 14, the figure of merit of the tunable capacitor device 12 is improved.

The tunable capacitor circuit 10 of the present invention is the solution for the tunable capacitor devices 12 when the limit of the performance is set by a low tuning/loss ratio (particularly for high loss situations) of a tuning element as is usually the case for the semiconductor and ferroelectric based tuning elements in the microwave frequency range, especially above ten (10) GHz. For the existing semiconductor and ferroelectric based tuning elements, several fold (at least 2–5 times) improvement in tuning/loss parameter is possible. Additional benefits are the improved power handling capability of tuning elements 14 (especially an issue for semiconductors) and reduced tuning voltages and improved temperature stability for the ferroelectric tuning elements. The improvement in the figure of merit as in the present invention will be realized at any RF frequency and any temperature as long as the loss of the non-tunable component is significantly lower than that of the tunable component. The potential embodiments of the tunable capacitor circuit 10 of the present invention include multi-layer integrated structures combining high loss tunable and low loss non-tunable layers or components, or separate lumped element capacitors integrated into a circuit in series.

The foregoing exemplary descriptions and the illustrative preferred embodiments of the present invention have been explained in the drawings and described in detail, with varying modifications and alternative embodiments being taught. While the invention has been so shown, described and illustrated, it should be understood by those skilled in the art that equivalent changes in form and detail may be made therein without departing from the true spirit and scope of the invention, and that the scope of the present invention is to be limited only to the claims except as precluded by the prior art. Moreover, the invention as disclosed herein, may be suitably practiced in the absence of the specific elements which are disclosed herein.

The invention claimed is:

1. A tunable circuit for a capacitively tunable device, the tunable circuit comprising:

a substrate;

a tunable circuit element;

a non-tunable dielectric clement coupled to the tunable circuit element, the substrate, tunable circuit element, and non-tunable dielectric element configured in a layered structure, wherein the tunable circuit element and non-tunable dielectric element are configured in a layered structure with the tunable circuit element being layered upon the non-tunable dielectric element and a pair of contacts contacting the tunable circuit element; and at least one AC terminal contacting only the non-tunable dielectric element.

2. The tunable circuit of claim 1 wherein the tunable circuit element and non-tunable dielectric element are coupled together in series.

3. The tunable circuit of claim 1 wherein the tunable circuit element and non-tunable dielectric element are configured as a single lumped element.

4. The tunable circuit of claim 1 wherein the non-tunable dielectric element is selected from the group consisting of non-tunable oxides and dielectric polymers.

5. The tunable circuit of claim 1 wherein the non-tunable dielectric element is deposited by a method selected from the group consisting of physical vapor deposition, spin coating, and ink jet writing.

6. A method for increasing the figure of merit in a tunable capacitor device, the method comprising:

providing a substrate;

providing a tunable element;

providing a non-tunable dielectric element with at least one AC terminal contacting only the non-tunable dielectric clement;

coupling the tunable element to the non-tunable dielectric element so that the substrate, tunable element, and non-tunable dielectric element are provided in a layered structure; and configuring the tunable element and the non-tunable dielectric element in a layered structure with the tunable element being layered upon the non-tunable dielectric element and a pair of contacts contacting the tunable element.

7. The method of claim 6 and further comprising:

selecting the non-tunable dielectric element from the group consisting of non-tunable oxides and dielectric polymers.

8. The method of claim 6 and further comprising:

depositing the non-tunable dielectric element by a method selected from the group consisting of physical vapor deposition, spin coating, and ink jet writing.

9. The method of claim 6 and further comprising:

coupling the tunable element and the non-tunable dielectric element in series.

10. The method of claim 8 and further comprising:

configuring the tunable element and the non-tunable dielectric element as a single lumped element.

11. A tunable capacitor device comprising:

a substrate;

non-tunable dielectric element;

a tunable circuit element electrically connected to the non-tunable dielectric element forming a combined dielectric element, the combined dielectric element being electrically connected to the substrate, the substrate, non-tunable dielectric element, and tunable circuit element configured in a layered structure with the tunable circuit element being layered upon the non-tunable dielectric element;

at least one AC terminal contacting only the non-tunable dielectric element; and a plurality of contacts mounted to the tunable circuit element.

12. The tunable capacitor device of claim 11 wherein the tunable circuit element and the non-tunable dielectric element are configured as a single lumped element.

13. The tunable capacitor device of claim 11 wherein the tunable circuit element and the non-tunable dielectric element are configured in a layered structure.

14. The tunable capacitor device of claim 11 wherein the non-tunable dielectric element is selected from the group consisting of non-tunable oxides and dielectric polymers.

15. The tunable capacitor device of claim 11 wherein the non-tunable dielectric element is deposited by a method selected from the group consisting of physical vapor deposition, spin coating, and ink jet writing.

16. The tunable capacitor device of claim 11 wherein the tunable circuit element directly contacts the non-tunable dielectric element.

17. The tunable capacitor device of claim 16 wherein each contact electrically contacts one of the tunable circuit element and the non-tunable dielectric element.

18. The tunable capacitor device of claim 11 wherein the non-tunable dielectric element directly contacts the substrate.

19. The tunable capacitor device of claim 18 wherein at least two contacts electrically contact the tunable circuit element and at least one contact electrically contacts the non-tunable dielectric element.

20. The tunable capacitor device of claim 11 wherein the non-tunable dielectric element is electrically connected to the tunable circuit element by a wire, solder, or other electrical contact.

21. The tunable capacitor device of claim 11 wherein the tunable circuit element and the non-tunable dielectric element are coupled together in series.

* * * * *